(12) United States Patent
Huang et al.

(10) Patent No.: US 10,193,092 B2
(45) Date of Patent: *Jan. 29, 2019

(54) SYSTEMS AND METHODS FOR SCALABLE PEROVSKITE DEVICE FABRICATION

(71) Applicant: NUtech Ventures, Lincoln, NE (US)

(72) Inventors: Jinsong Huang, Lincoln, NE (US); Qingfeng Dong, Lincoln, NE (US); Yuchuan Shao, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,473

(22) Filed: Jan. 24, 2017

(65) Prior Publication Data
US 2017/0133161 A1 May 11, 2017

Related U.S. Application Data

(63) Continuation of application No. 15/009,718, filed on Jan. 28, 2016, now Pat. No. 9,583,724.
(Continued)

(51) Int. Cl.
*H01G 9/20* (2006.01)
*H01L 51/42* (2006.01)
*H01L 51/44* (2006.01)
*H01L 51/00* (2006.01)
*H01G 9/00* (2006.01)

(52) U.S. Cl.
CPC ......... *H01L 51/424* (2013.01); *H01G 9/0029* (2013.01); *H01G 9/2009* (2013.01); *H01L 51/0012* (2013.01); *H01L 51/0021* (2013.01); *H01L 51/0026* (2013.01); *H01L 51/0028* (2013.01); *H01L 51/4213* (2013.01); *H01L 51/442* (2013.01); *H01L 51/0035* (2013.01); *H01L 51/0037* (2013.01);
(Continued)

(58) Field of Classification Search
CPC .. H01G 9/2009; H01G 9/0029; H01L 51/442; H01L 51/0021; H01L 51/0026; H01L 51/4213; H01L 51/0012; H01L 51/0037; H01L 51/0047; H01L 51/0077; H01L 51/0035
See application file for complete search history.

(56) References Cited

U.S. PATENT DOCUMENTS 4,030,964 A 6/1977 Schieber et al.
5,641,544 A 6/1997 Melancon et al.
(Continued)

FOREIGN PATENT DOCUMENTS

CN 104131352 A 11/2014
WO WO 2014/020499 A1 2/2014

OTHER PUBLICATIONS

International Preliminary Report on Patentability for PCT/US2016/015458 dated Aug. 10, 2017.
(Continued)

*Primary Examiner* — William Coleman
(74) *Attorney, Agent, or Firm* — Leydig, Voit & Mayer, Ltd.; Gerald T. Gray

(57) ABSTRACT

Continuous processes for fabricating a perovskite device are described that include forming a perovskite layer or film on a substrate using a linear deposition device, and optionally using a conductive tape lamination process to form an anode or a cathode layer on the perovskite device.

21 Claims, 5 Drawing Sheets

Related U.S. Application Data

(60) Provisional application No. 62/108,873, filed on Jan. 28, 2015.

(52) U.S. Cl.
CPC ...... *H01L 51/0047* (2013.01); *H01L 51/0077* (2013.01); *Y02E 10/549* (2013.01)

(56) References Cited

U.S. PATENT DOCUMENTS

| | | |
|---|---|---|
| 6,350,946 B1 | 2/2002 | Miyake et al. |
| 6,511,615 B1 | 1/2003 | Dawes et al. |
| 9,082,992 B2 | 7/2015 | Guo et al. |
| 9,583,724 B2 * | 2/2017 | Huang ............... H01L 51/4213 |
| 2002/0179000 A1 | 12/2002 | Lee et al. |
| 2003/0059540 A1 | 3/2003 | Berni et al. |
| 2006/0268493 A1 | 11/2006 | Miyasaka et al. |
| 2010/0001619 A1 | 1/2010 | Yuuya et al. |
| 2015/0144195 A1 | 5/2015 | Irwin et al. |
| 2015/0318477 A1 | 11/2015 | Irwin et al. |

OTHER PUBLICATIONS

International Preliminary Report on Patentability for PCT/US2016/015472 dated Aug. 10, 2017.
International Search Report for PCT/US2016/015458 dated Jun. 3, 2016.
International Search Report for PCT/US2016/015472 dated Jun. 3, 2016.
Kojima et al., "Organometal Halide Perovskites as Visible-Light Sensitizers for Photovoltaic Cells", *Journal of the American Chemical Society*, vol. 131, Apr. 14, 2009, pp. 6050-6051.
Liu et al., "Efficient Planar Heterojunction Perovskite Solar Cells by Vapour Deposition", *Nature*, Macmillan Publishers, vol. 501, Sep. 19, 2013, pp. 395-398.
Lee et al., "Efficient Hybrid Solar Cells Based on Meso-Superstructured Organometal Halide Perovskites", *Science*, vol. 338, Nov. 2, 2012, pp. 643-647.
Huang et al. "A semi-transparent plastic solar cell fabricated by a lamination process." *Advanced materials* 20.3 (2008): 415-419.
Kim et al., "Lead Iodide Perovskite Sensitized All-Solid-Sate Submicron Thin Film Mesocopic Solar Cell with Efficiency Exceeding 9%", *Scientific Reports*, S:591, Aug. 2, 2012, pp. 1-8.

* cited by examiner

SYSTEMS AND METHODS FOR SCALABLE PEROVSKITE DEVICE FABRICATION

CROSS-REFERENCE TO RELATED APPLICATIONS

This patent application is a continuation of U.S. Non-Provisional patent application Ser. No. 15/009,718, filed Jan. 28, 2016, and claims the benefit of U.S. Provisional Patent Application No. 62/108,873, filed Jan. 28, 2015, which are both incorporated herein by reference.

STATEMENT REGARDING FEDERALLY SPONSORED RESEARCH AND DEVELOPMENT

This invention was made with Government support under contract DE-EE0006709 awarded by the Department of Energy (DOE) and under contract HDTRA1-14-1-0030 awarded by the Defense Threat Reduction Agency (DTRA). The Government has certain rights in this invention.

BACKGROUND

The Sun deposits 120,000 terawatts (TW) of power onto the Earth's surface. This is more than the 13 TW of total power that is currently used by the planet's population. Photovoltaics (PV) convert solar energy into direct current electricity using semiconducting materials that exhibit the photovoltaic effect. The photovoltaic effect includes photons of light exciting electrons into a higher state of energy, allowing them to act as charge carriers for an electric current. A photovoltaic system can employ solar panels including a number of solar cells to supply usable solar power.

Organometal trihalide perovskites (OTPs, e.g., $CH_3NH_3PbX_3$, X=Cl, Br, I or a mixed halide) can be excellent low-cost, earth-abundant photovoltaic materials due to proper bandgap, excellent crystallinity, and strong absorption. In addition, OTPs have advantageous optoelectronic properties, such as a very large carrier mobility comparable to silicon, bipolar transport, and large charge carrier diffusion length, which enables high performance devices with the traditional planar heterojunction (PHJ) structure.

Perovskite photovoltaic devices (PPVs) have been demonstrated to have all the desired properties of organic photo voltaic devices (OPVs), which have strong market potential in military and civilian applications, including for flexible, wearable, lightweight, and portable chargers for electronics, building-integrated photovoltaics (BIPVs), and off-grid power generation. PPVs have shown all three main competencies of that OPVs have over other photovoltaic technologies: 1) PPVs can be made on flexible plastic substrates; 2) PPVs can be fabricated with low cost materials and a solution process; 3) Perovskite materials have tunable color and bandgaps with semitransparency, which allows for the integration of PPVs into buildings. State-of-the-art PPV devices can have an efficiency of 20%, but they need to reach 25% to compete with other commercialized thin film solar cell technologies in order to make them commercially viable. The thermodynamic efficiency limit of single junction PPVs can be 38% based on its bandgap.

High mobility and lifetime is important for photonic devices because the light-generated electrons and holes can move longer distances to be extracted as current, thus avoiding release of their energy as heat by the recombination. High mobility and high carrier lifetimes are also crucial for photo detectors. For example, in an organic/inorganic hybrid photo detector, if one type of carriers (e.g., electrons) can be trapped longer, the other type of carriers (e.g., holes) thus circulates many times with high mobility through the polymer matrix or network. In this case, ultra-high gain (gain may be defined by the ratio of the lifetime of the trapped electrons and the transit time of holes), can be obtained.

Despite the high efficiency reported in devices fabricated by thermal evaporation, the complicated controlling of the non-stoichiometry of OTPs such as $CH_3NH_3PbI_{3-x}Cl_x$ by co-evaporation under high vacuum dims its advantage of being low cost. Low temperature solution processes are attractive in the fabrication of electronic devices, especially large-area solar cells, for reducing fabrication costs.

Thin film photovoltaic devices based on OTPs are a promising area of renewable energy research. These solar cells utilize light harvesting thin films include a polycrystalline perovskite with a structure of $AMX_3$, where A is an organic and/or inorganic cation, (e.g., methylammonium ($CH_3NH_3+$(MA+), $NH2CH=NH2+$, (FA+) Cs+)), the M is a metal cation, (e.g., Pb2+, Sn2+), and X is a halide anion (e.g., I—, Cl—, and/or Br—). Power conversion efficiencies (PCE) of perovskite solar cells using these methods can exceed 16%. The solution processability of OTPs enables the capitalization of development in organic photovoltaics (OPVs) for low-cost, high-throughput production of OPT solar panels on both rigid and flexible substrates. However, current methods in fabricating high efficiency perovskite devices (e.g., solar cells), such as spin-coating or thermal evaporation, are not compatible with large-scale production processes, such as a roll-to-roll process. There is lack of a film deposition methodology for perovskite films which can be compatible with roll-to-roll fabrication processes for large scale production of perovskite solar cell panels while still achieving high performance.

Accordingly, there is a need for improved photoactive devices including OTPs as an active layer as well as improved methods for fabricating such photoactive devices.

SUMMARY

Accordingly, the present disclosure generally provides systems and methods for fabricating photoactive device structures, and more particularly to photoactive devices including a photoactive perovskite film layer and systems and methods for fabricating the same. In certain embodiments, a conductive tape lamination process is used to form an anode or a cathode layer on the photoactive device.

In certain embodiments, doctor blade coating techniques are used to facilitate formation of a photoactive layer and/or other material layers during the fabrication processes. Utilizing a doctor blade coating process is advantageous because of increased scalability for perovskite device roll-to-roll production, simplicity, and cost effectiveness. Furthermore, doctor-blading also provides advantages due to high-throughput deposition, high material usage, and application onto flexible substrates. Perovskite films and devices fabricated using a doctor-blade coating can have advantageously long carrier diffusion lengths (e.g., up to 3 µm thick) due to the dramatically higher carrier mobility in the blade-coated films. Such doctor-blade deposition can be utilized for large area perovskite cells fabricated with high volume roll-to-roll production.

In certain embodiments, conductive tape lamination techniques are used to facilitate formation of conductive device layers as an anode layer and/or a cathode layer in the fabrication processes. Lamination using conductive tape advantageously allow for reduced fabrication and material costs and increased protection and stability of the device(s) formed.

According to an embodiment, a process or method for fabricating a perovskite device is provided. The process typically includes receiving a substrate, applying a perovskite precursor solution onto the substrate, and linearly swiping the perovskite precursor solution using a doctor blade to form a perovskite film on the substrate. In certain aspects, the process includes simultaneously heating the substrate while applying and linearly swiping the perovskite precursor solution. In certain aspects, heating the substrate includes heating the substrate to a temperature in a range of between about 50° C. and about 180° C. In certain aspects, heating the substrate includes heating the substrate to about 125° C. In certain aspects, the substrate is moving and the doctor blade is stationary. In certain aspects, the substrate is moving at a rate of about 0.75 cm/sec to about 75 cm/sec relative to the doctor blade. In certain aspects, the substrate is stationary and wherein the doctor blade moves relative to the substrate. In certain aspects, applying the perovskite precursor solution onto the substrate includes dispensing between about 10 μL and about 20 μL of perovskite precursor solution for every 2.25 mm$^2$ of substrate.

In certain aspects, the precursor solution includes a lead halide (e.g., $PbI_2$, $PbBr_2$ or $PbCl_2$) and at least one of a methylammonium halide (e.g., $CH_3NH_3I$, $CH_3NH_3Br$, $CH_3NH_3Cl$) or a formamidinium halide (e.g., $CH(NH_2)_2I$, $CH(NH_2)_2Br$, $CH(NH_2)_2Cl$) dissolved in dimethylformamide (DMF) or Methyl sulfoxide (DMSO) or a mixture of two or more thereof in any ratio.

In certain aspects, the substrate comprises indium tin oxide (ITO) or other transparent conductive electrodes. In certain aspects, the process further includes heating the perovskite device, and rolling a conductive tape onto the perovskite device, wherein the conductive tape includes an adhesive material and a conductive material. In certain aspects, heating the perovskite device includes heating the perovskite device to a temperature between about 50° C. and about 175° C.

According to another embodiment, a process or method for continuously laminating a perovskite device is provided. The process typically includes forming a perovskite device by doctor blade coating a perovskite precursor solution onto a substrate, heating the perovskite device, and rolling or otherwise applying a conductive tape onto the perovskite device, wherein the conductive tape includes an adhesive material and a conductive material In certain aspects, heating the perovskite device includes heating the perovskite device to a temperature between about 50° C. and about 175° C. In certain aspects, the conductive material includes at least one of aluminum, copper, nickel, gold, or silver. In certain aspects, the substrate comprises indium tin oxide (ITO) or other transparent conductive electrode materials.

According to yet another embodiment, a process or method for fabricating a perovskite device is provided. The process typically includes heating an indium tin oxide (ITO) substrate, applying a perovskite precursor solution onto the ITO substrate, linearly swiping the perovskite precursor solution using a doctor blade to form a perovskite film, simultaneously thermoannealing and solvent annealing the perovskite film, depositing a charge transport layer on the perovskite film, thermoannealing the charge transport layer, depositing a fullerene layer on the charge transport layer, and applying an conductive layer to the fullerene layer. In certain aspects, the ITO substrate includes an ITO layer and a hole transport layer. In certain aspects, the hole transport layer includes at least one of PEDOT:PSS, TPD plus TPACA or PTAA, or other hole transport material or materials. In certain aspects, the hole transport layer may be processed by an argon plasma process to enhance the adhesion of the solution thereto.

In certain aspects, the precursor solution includes a lead halide (e.g., $PbI_2$, $PbBr_2$ or $PbCl_2$) and at least one of a methylammonium halide (e.g., $CH_3NH_3I$, $CH_3NH_3Br$, $CH_3NH_3Cl$) or a formamidinium halide (e.g., $CH(NH_2)_2I$, $CH(NH_2)_2Br$, $CH(NH_2)_2Cl$) dissolved in dimethylformamide (DMF) or Methyl sulfoxide (DMSO) or a mixture of two or more thereof in any ratio.

In certain aspects, the ITO substrate is linearly moving. In certain aspects, applying the perovskite precursor solution onto the ITO substrate includes dropping or dispensing between about 10 μL and about 20 μL of perovskite precursor solution for every 2.25 mm2 of ITO substrate. In certain aspects, simultaneously thermoannealing and solvent annealing the perovskite film includes thermoannealing at about 100° C. for about 60 minutes. In certain aspects, simultaneously thermoannealing and solvent annealing the perovskite film includes solvent annealing with about 10 μL of DMF.

In certain aspects, depositing a charge transport includes depositing a $PC_{60}BM$ layer includes depositing PC60BM dissolved in 2% by weight 1,2-dichlorobenzene (DCB) solution. In certain aspects, thermoannealing the $PC_{60}BM$ charge transport layer includes thermoannealing at about 100° C. for about 60 minutes. In certain aspects, applying a conductive layer to the fullerene layer includes depositing a layer of conductive metal on the fullerene layer. In certain aspects, applying a conductive layer to the fullerene layer includes applying a conductive tape onto the fullerene layer. In certain aspects, depositing a $PC_{60}BM$ layer includes depositing $PC_{60}BM$ dissolved in 2% by weight 1,2-dichlorobenzene (DCB) solution. In certain aspects, depositing a charge transport layer includes depositing one of a $PC_{60}BM$ layer, a fullerene derivative layer, a ZnO layer, a $SnO_2$ layer or a $TiO_2$ layer.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DRAWINGS

The detailed description is described with reference to the accompanying figures. The use of the same reference numbers in different instances in the description and the figures may indicate similar or identical items.

DETAILED DESCRIPTION

The present disclosure generally provides systems and methods for fabricating photoactive device structures, and more particularly to systems and methods for fabricating perovskite device including a photoactive perovskite film layer. In certain embodiments, a conductive tape lamination process is used to form an anode or a cathode layer on the photoactive device.

In certain embodiments, doctor blade coating techniques are used to facilitate formation of a photoactive layer and/or other material layers during the fabrication processes. Utilizing a doctor blade coating process is advantageous because of increased scalability for perovskite device roll-to-roll production, simplicity, and cost effectiveness. Furthermore, doctor-blading also provides advantages due to high-throughput deposition, high material usage, and application onto flexible substrates. Perovskite films and devices fabricated using a doctor-blade coating can have advantageously long carrier diffusion lengths (e.g., up to 3 µm thick) due to the dramatically higher carrier mobility in the blade-coated films. Such doctor-blade deposition can be utilized for large area perovskite cells fabricated with high volume roll-to-roll production.

In certain embodiments, conductive tape lamination techniques are used to facilitate formation of conductive device layers as an anode layer and/or a cathode layer in the fabrication processes. Lamination using conductive tape advantageously allow for reduced fabrication and material costs and increased protection and stability of the device(s) formed.

Figure 1:
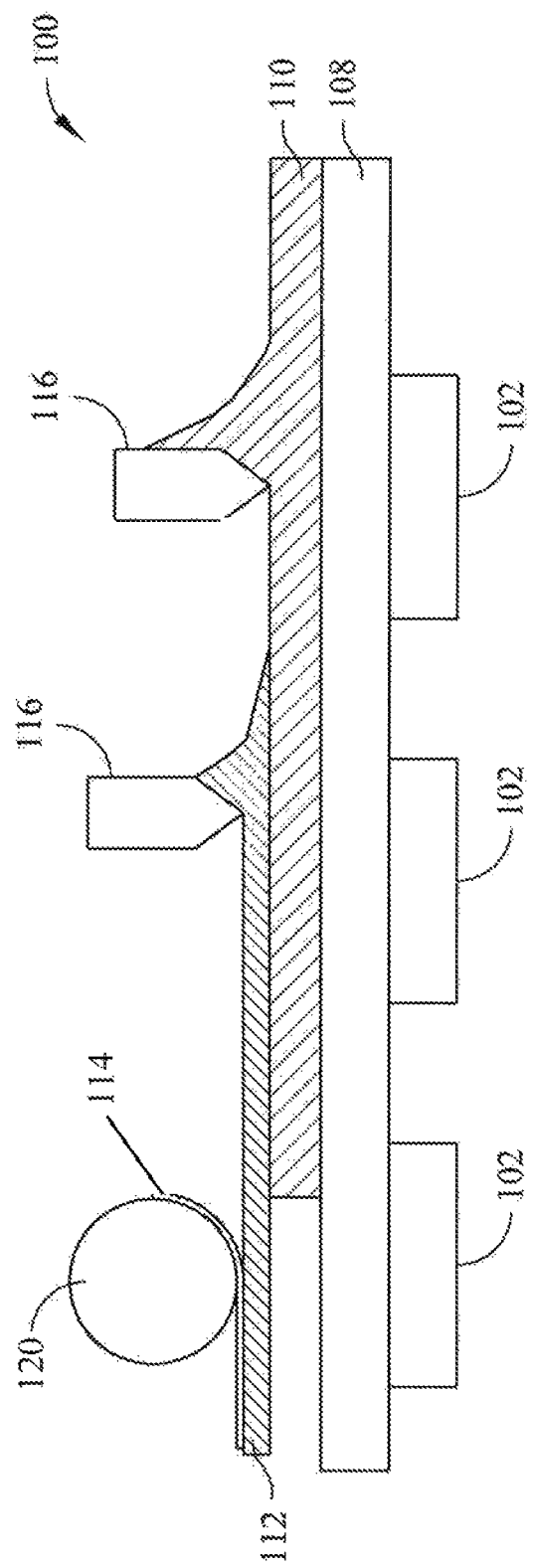
FIG. 1 is an environmental process view illustrating a continuous process for fabricating a perovskite device using a doctor blade and lamination of a conductive tape, in accordance with an embodiment of the present disclosure.
Figure 2:
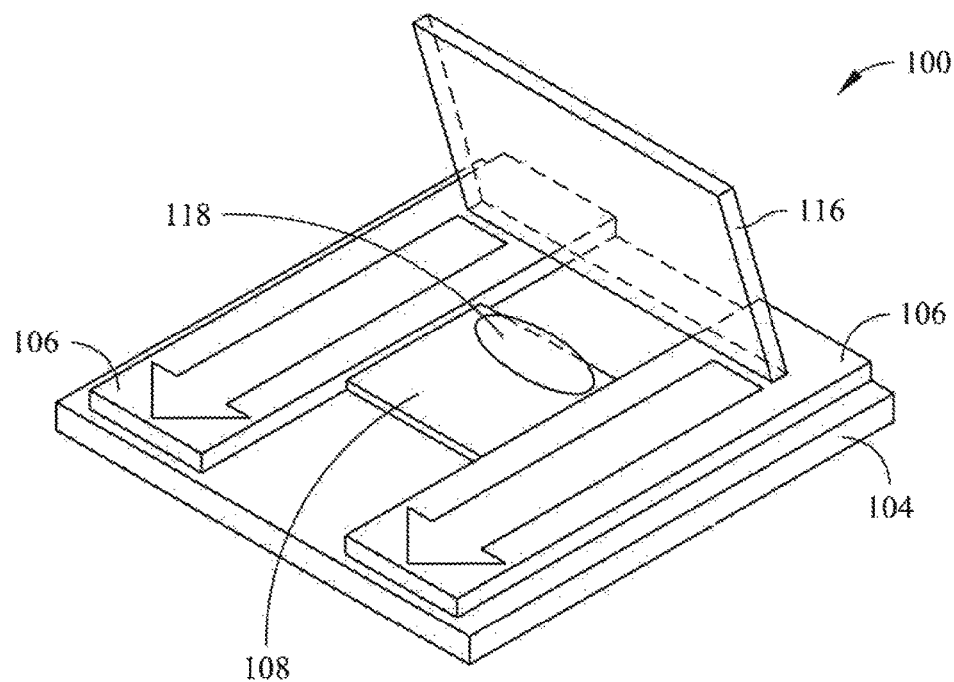
FIG. 2 is an isometric environmental process view illustrating a continuous process for fabricating a perovskite device using a doctor blade, in accordance with an embodiment of the present disclosure.
Figure 3:
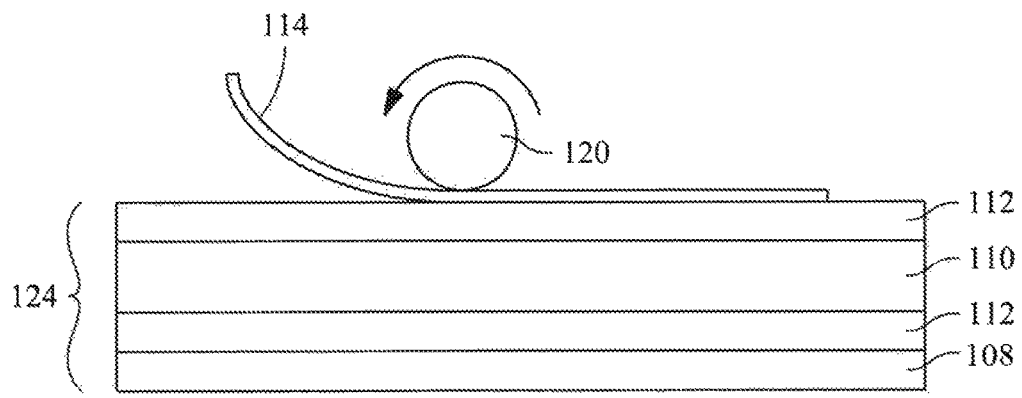
FIG. 3 is an environmental process view illustrating a continuous process for fabricating a perovskite device using a rolling and laminating process for applying a conductive tape, in accordance with an embodiment of the present disclosure.

FIGS. 1 through 3 illustrate embodiments of a perovskite device structure 124 and methods for fabricating the perovskite device 124 utilizing a doctor blade coating process and a conductive tape laminating process. It should be appreciated that the doctor blade coating process and a conductive tape laminating process need not be used together, e.g., a device may be formed with the doctor blade coating process but without the lamination process, or a device could be fabricated using the lamination process, but not the blade-coating process. However, the description herein will generally refer to devices formed using both the blade coating process and the lamination process.

In certain embodiments, perovskite device 124 can be fabricated using a perovskite device fabrication apparatus 100, as illustrated in FIGS. 1 through 3. As shown in FIGS. 1 and 2, an embodiment of a perovskite device fabrication apparatus 100 includes at least one heating device 102 (three shown), at least one doctor blade 116 (two shown), and at least one rod assembly 120. In an embodiment, a heating device 102 can include a device configured to provide heat to a substrate 108 (e.g., an ITO substrate 108 as shown in FIG. 1 or to a different substrate such as a steel or silicon substrate 104 upon which the substrate 108 may be located or attached. The substrate 108 may be stationary with respect to each heater 102, or the substrate 108 may continuously move in a linear configuration relative to the heaters 102. Some examples of a heating device 102 can include a convective and/or radiative heater or heating element. It is contemplated that a heating device 102 may include other heaters using other heating methods.

The perovskite device fabrication apparatus 100 can include at least one doctor blade 116 configured to deposit, form, and/or evenly distribute a material 118 applied to or dropped onto the substrate 108 (e.g., ITO substrate) or onto perovskite device 124, e.g., a charge transport layer material 112 applied to or dropped onto perovskite film layer 110. A doctor blade 116 may include a blade, such as a glass blade, and/or device for removing excess accumulated material from a surface. Advantages of utilizing doctor blading include scalability for roll-to-roll production, simplicity, and cost effectiveness. Additionally, doctor-blading can be adapted for high throughput deposition, high material usage, and material application onto flexible substrates. In an embodiment, a doctor blade 116 can remove excess perovskite (e.g., $MAPbI_3$) precursor solution from the surface of substrate 108 as the precursor solution is dropped on the substrate 108. In another embodiment, the same or another doctor blade 116 can remove excess charge transport material 112 from the surface of a perovskite film 110.

In one embodiment, the perovskite device fabrication apparatus 100 includes a rod assembly 120 configured for applying pressure and/or heat to a conductive tape 114 during a lamination process. The rod assembly 120 can include a rod and/or a roller configured with a harness or other biasing mechanism to apply pressure to a conductive tape 114 as the conductive tape 114 is continuously rolled and laminated to the surface of a charge transport material 112 and/or perovskite device 124.

FIG. 2 illustrates an apparatus 100 for use in doctor blade coating one or more materials to form a perovskite device according to an embodiment. As shown in one embodiment, device 110 includes a heat conductive holding substrate layer 104, such as a silicon or steel substrate, and a pair of guiding elements 106, which may be glass or silicon layers arranged to facilitate doctor-blade coating as shown. For example, a substrate 108 (e.g., an ITO substrate) may be located or positioned between the pair of guiding elements 106 as shown. A drop of material 118 (e.g., perovskite precursor solution) applied to the substrate 108 is doctor blade coated using doctor blade 116. In one embodiment, the substrate 108 may be stationary, wherein the doctor blade 116 moves linearly across the substrate 108 using the guide elements 106 to control process parameters. In another embodiment, the doctor blade 116 may be stationary, wherein the substrate 108 moves linearly underneath the blade 116 using the guide elements 106 to control process parameters. For example, the guide elements may have a specific height such that the height difference between the substrate 108 and the guide elements controls the thickness of the perovskite layer 110 produced. Mechanical elements such as linear actuators and motors may be coupled with the blade 116 and/or the substrate 108 and/or holding substrate 104 to control movement of the blade 116, the substrate 108 and/or holding substrate 104.

FIG. 3 illustrates a rolling and laminating process for applying a conductive tape to a perovskite device 124 in accordance with an embodiment of the present disclosure. As shown roller element 120 rolls and applies a lamination layer 114, which may include a conductive tape to the device structure 124. As shown, the tape 114 is applied to a charge transport layer 112, however, it should be appreciated that the tape layer may be applied directly to perovskite layer 110, or to any other layer in the device structure to be laminated.

Figure 4:
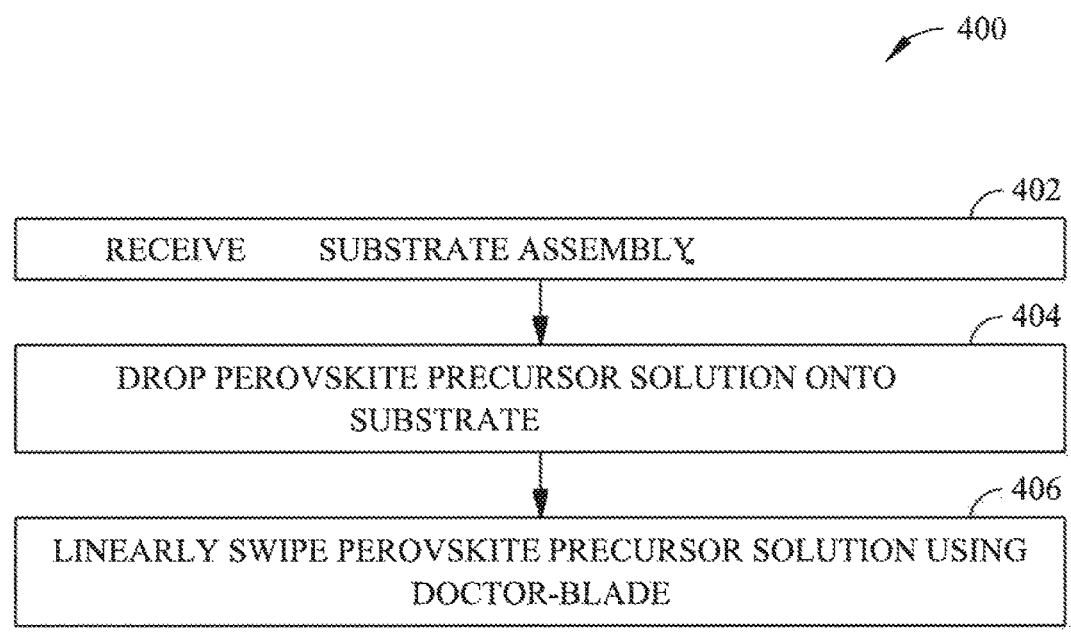
FIG. 4 is a flow diagram illustrating an embodiment of a continuous process for fabricating a perovskite solar device using a doctor blade, such as the perovskite device illustrated in FIGS. 1 through 3.

FIG. 4 illustrates a process 400 for fabricating a photoactive perovskite device, such as device 124 as shown in FIGS. 1 through 3. The device formed may be a solar cell, photodetector or solar panel or other photoactive device. In some implementations, process 400 may be performed in a $N_2$ atmosphere. In step 402, a substrate (e.g., substrate 108) is received. In certain embodiments, receiving substrate 108 can include receiving an ITO substrate assembly 122 in a continuous fashion (e.g., a continuous assembly production process) or in a discrete process (e.g., sheets or panels of an ITO substrate assembly that are processed using the perovskite device fabrication apparatus 100 in batches. In one specific embodiment, receiving the substrate assembly can include receiving a moving substrate 108. In another embodiment, receiving can include positioning a stationary substrate.

In step 404, a perovskite precursor solution is dropped onto the substrate 108. In one embodiment, the perovskite precursor solution includes $PbI_2$ and a methylammonium halide, such as methylammonium iodide (e.g., $CH_3NH_3I$, MAI), mixed in dimethylformamide (DMF). In one specific embodiment, a perovskite precursor solution can be dropped onto an ITO substrate 108 including a hole transport material or a hole transport material layer. Dispensing a perovskite precursor solution can include using a continuous liquid dispenser or a syringe to apply a drop or amount of material. In a specific embodiment, about 10 to about 20 μL of perovskite precursor solution can be dropped for about every 2.25 $mm^2$ of ITO substrate 108. Other processes, such as spin coating, may require as much as 50-100 μL of the same perovskite precursor solution over the same substrate area.

Purification of the perovskite precursor solution (e.g., MAI) may be important for doctor-blade coating of a smooth perovskite film 110. Perovskite precursor solutions made from $PbI_2$ and a non-purified MAI may immediately become visibly cloudy even after filtration of precursor solution with a pore size filter. This may be caused by the reaction of $Pb^{2+}$ with an impurity (e.g., $PO_2^{3-}$ that forms insoluble $PbPO_3$ particles). In some implementations, HI and $CH_3NH_2$ (MA) solutions can be used as the starting materials for MAI synthesis. While an HI solution contains 2% $H_3PO_2$ (e.g., from Sigma-Aldrich) as a stabilizer to prevent the decomposition of HI, $H_3PO_2$ may also react with MA to form $(MA)_3PO_2$, which may be difficult to remove using a regular MAI washing process because of its high solubility in washing solvent (e.g., ethanol). In order to eliminate impurities, MAI may be purified by recrystallization (i.e, cooling a high-temperature supersaturated MAI solution to obtain purified MAI crystals). Due to very high solubility of $(MA)_3PO_2$ in ethanol and the low percentage of $(MA)_3PO_2$ in MAI, $(MA)_3PO_2$ is not recrystallized and remains in the solution. Perovskite precursor solutions made from $PbI_2$ with purified MAI in DMF can appear very clear without any visible appearance change after storage for several months at ambient conditions. Perovskite films formed using non-purified MAI are generally non-continuous with micrometer wide gaps between the large domains, which may be caused by impurities pushed toward the edges during the grain growing process. In sharp contrast, perovskite films deposited from purified MAI are often absent of gaps between big domains.

In step 406, the perovskite precursor solution is doctor-bladed, e.g., linearly swiped using a doctor blade, to form layer 110. For example, a blade 116 (e.g., a glass blade) may be moved across the perovskite solution 118 dropped on the substrate, or the blade 116 may be stationary and the substrate, with the dropped perovskite solution, may be moved relative to the blade 116. In one embodiment, a perovskite precursor solution can be swiped linearly by a doctor blade 116 at a high speed of about 0.75 cm/s (27 m/hour) resulting in a perovskite film 110. The relative rate of motion of the blade and the substrate 108 may be at a linear rate of between about 0.1 cm/sec and about 1.0 cm/sec to 10 cm/sec to 75 cm/sec or greater. In one specific embodiment, the relative rate of motion is about 0.75 cm/sec. It is contemplated that other rates may be utilized when scaling the process. The rate of motion of the doctor blade 116 and/or the substrate 108 may be varied. The doctor blade 116 functions, in certain aspects, to remove excess perovskite precursor solution 118 and smooth the remaining perovskite precursor solution. A high blading speed is advantageous when fabricating large area perovskite devices, such as solar panels, with a high throughput. The thickness of the perovskite film 110 during doctor-blade coating may be controlled by perovskite precursor solution concentration, blading speed and the relative spacing between the doctor-blade 116 and the substrate 108. In some embodiments, the substrate 108 can be maintained at an elevated temperature during doctor-blade coating for the formation of a smooth, pin-hole free perovskite film 110. During doctor-blade coating, the substrate temperature can be an important parameter for creating uniform, smooth and pin-hole free perovskite films. When a substrate, e.g., an ITO substrate, is held at a temperature much lower than the boiling point of DMF (about 153° C.) or DMSO (about 189° C.), the perovskite film drying time may be too long and may cause slow crystallization of the perovskite, which in turn may create a rough, discontinuous perovskite film 110. For example, a perovskite film formed at 100° C. may be non-uniform and may contain numerous μm-wide pinholes, which yields low device power conversion efficiency (PCE) (e.g., below 7%). However, quick drying of a perovskite film (e.g., within about 2 seconds) can create uniform and continuous perovskite films. In certain embodiments, therefore, the substrate is held at a temperature in the range of between about 100° C. and about 190° C. In one example, a perovskite film 110 deposited at about 135° C. can be continuous and smooth. Too high temperature is avoided because it may cause rapid decomposition of $MAPbI_3$ within the perovskite precursor solution.

A blade-coated perovskite film can have a unique domain structure with very large polygon shape domains having a lateral size in the order of about 80 μm to about 250 μm. By controlling the substrate temperature, blading speed, perovskite precursor solution concentration (between about 10% (i.e., 100 mg perovskite in 1 ml solvent) to about 60%, and/or using purified precursor (e.g., MAI mixed with a $PbI_2$) solution, a large area perovskite film disposed on an substrate 101, e.g., ITO substrate, can be coated with a perovskite film having a thickness in the range of from about 0.2 μm to over 10 μm. Lower concentration of the precursor solution in the range of about 10% to about 35% can result in a concentric ring structure superimposed in each of the polygon shape domains, giving a vivid colorful perovskite film observable by the naked eye.

In certain embodiments, perovskite device 124 may be processed to include an electrode layer opposite the substrate to act as an anode or cathode (the substrate, e.g., ITO, may act as the cathode or anode, respectively). In one embodiment, conventional conductive material deposition techniques may be used to form a conductive layer, e.g., deposition of a metal layer or conductive layer. In another embodiment, a conductive tape may be applied as will be described below.

Figure 5:
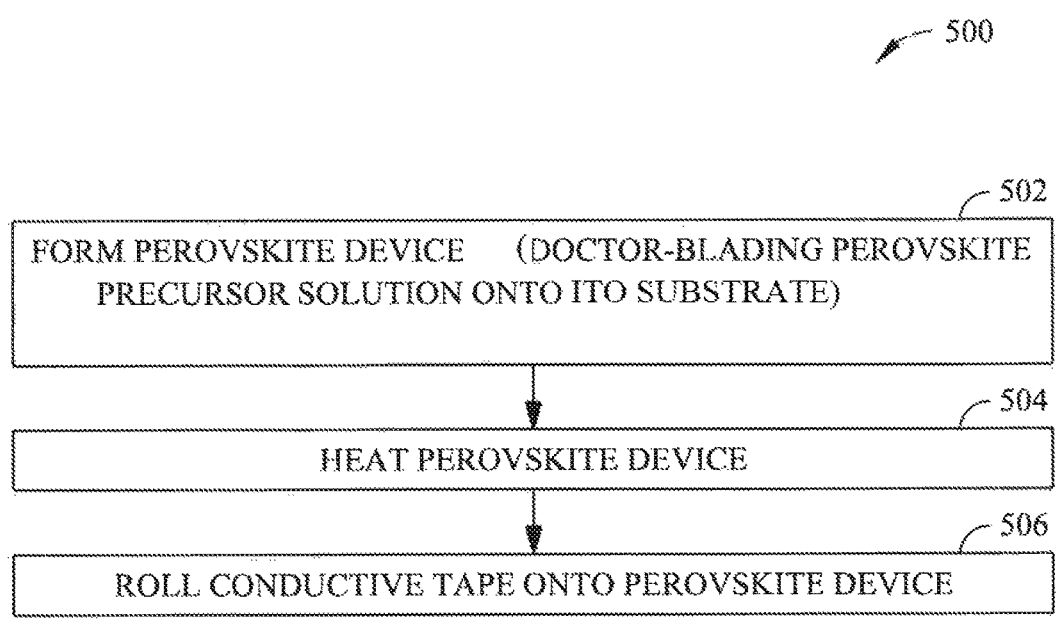
FIG. 5 is a flow diagram illustrating an embodiment of a continuous process for laminating conductive tape onto a perovskite device, such as the perovskite device illustrated in FIGS. 1 through 3.

As shown in FIG. 5, process 500 illustrates a process for laminating a conductive tape 114 onto a perovskite device, e.g., perovskite device 124 (FIG. 3) according to an embodiment. Process 500 may be performed in a $N_2$ atmosphere. In step 502, a perovskite device is formed, e.g., by doctor-blading a perovskite precursor solution onto a substrate as described herein, or otherwise formed, or provided for lamination.

In step 504, the perovskite film or device is heated. In an embodiment, at least one heater device 102 (FIG. 1) can be used to heat the substrate 108, the perovskite film 110, the perovskite device 124, and/or the perovskite device fabrication apparatus 100. For example, a perovskite device 124 with a perovskite film 110 can be heated to about 60-100° C. Heating the substrate 108 and/or the perovskite device 124 may improve contact between a subsequently applied conductive tape 114 and the perovskite film 110 or other material layer.

In step 506, conductive tape 114 is rolled and laminated onto the heated perovskite device. By replacing a traditional metal electrode with a conductive tape 114, the cost of a perovskite device 124 can be dramatically reduced. In certain embodiments, conductive tape 114 may include an adhesive material (e.g., acrylic, etc.) and a conductive material (e.g., aluminum, copper, nickel, gold, silver, etc.). In one embodiment, conductive tape 114 is rolled onto a perovskite device 124 and/or a perovskite film 110 (e.g., as a cathode or an anode) using a rod assembly 120 (e.g., a rod, roller, etc.) with a harness and pressure or biasing mechanism to provide sufficient pressure to apply the tape 114. In some embodiments, a charge transport material 112 may be deposited on the perovskite film 110 before the rolling and/or lamination of a conductive tape 114. In other embodiments, charge transport material 112 may be integrated into the conductive tape 114 as a cathode or an anode. Examples of useful charge transport materials might include fullerene (C60), fullerene self-assembly (C60-SAM), indene-C60 bisadduct (ICBA), [6,6]-phenyl-C61-butyric acid methyl ester (PCBM), indene-C60 bisadduct (ICBA), poly[bis(4-phenyl)(2,4,6-trimethylphenyl)amine] (PTAA), Tin Oxide ($SnO_2$), Zinc Oxide (ZnO), Titanium Oxide ($TiO_2$).

Utilizing a conductive tape 114 advantageously protects and increases the stability of a perovskite device 124 because the conductive tape 114 can encapsulate the perovskite device 124. In a specific embodiment, the conductive tape 114 can include a copper conductive tape with nickel particles disposed in the adhesive (commercially available as product number 16067-1, Ted Pella Inc.). In other embodiments, a conductive tape 114 can also be implemented into a perovskite device 124 (e.g., a solar cell) with an inverted structure as an anode. For example, a perovskite device 124 structure may include a fluorine-doped tin oxide (FTO), an electron transport layer, a perovskite film, a hole transport layer, and a conductive tape 114 that functions as an anode.

The stability of a perovskite device 124 including a laminated conductive tape 114 may be increased compared to a device with a traditional metal electrode. A conductive tape 114 has an excellent lamination function that can effectively prevent a perovskite film 110 from being exposed to ambient air, which air exposure can compromise the integrity of the perokskite material leading to a decrease in the effectiveness of the perovskite device 124. A conductive tape 114 can serve both as an electrode and a lamination or encapsulation layer. Further, the multifunction nature of a conductive tape 114 simplifies device fabrication by omitting the metal electrode deposition process and the encapsulation process.

Figure 6:
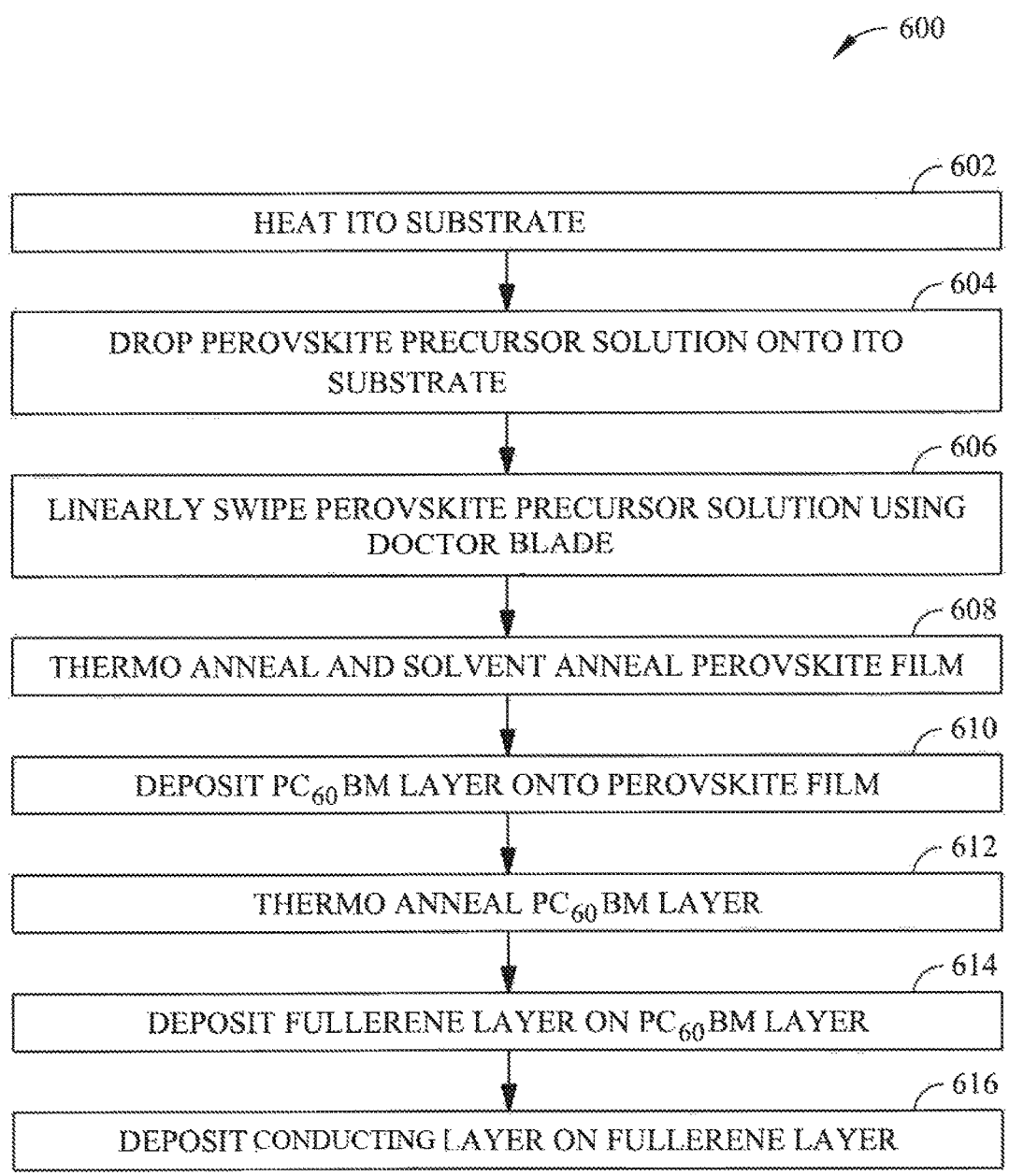
FIG. 6 is a flow diagram illustrating a continuous process for fabricating a perovskite device according to an embodiment.

FIG. 6 illustrates a process 600 for fabricating a doctor-bladed perovskite device according to an embodiment. In one embodiment, a perovskite device structure formed according to process 600 includes an ITO substrate (functioning as anode), a hole transport layer, a perovskite film 110 (e.g., $MAPbI_3$), an electron transport layer (e.g., [6,6]-phenyl-C61-butyric acid methyl ester ($PC_{60}BM$), $C_{60}$, and/or 2,9-dimethyl-4,7-diphenyl-1,10-phenanthroline (BCP)), and a cathode (e.g., Al, Ag, Cu or Au, etc.) layer. Process 600 may be performed in a $N_2$ atmosphere.

In step 602, an ITO substrate (e.g., an ITO coated glass substrate) is heated. Processing may begin by cleaning an ITO coated glass substrate, e.g., cleaning with deionized water, acetone, and UVO cleaner. Additionally, a hole transport layer may be deposited on, or otherwise formed on, the ITO substrate. In one specific embodiment, a hole transport layer (e.g., Poly(3,4-ethylenedioxythiophene)-poly(styrenesulfonate) (PEDOT:PSS),) can be applied to the ITO substrate and dried (e.g., in air at 135° C. for 20 min for PEDOT:PSS, or in $N_2$ at 100° C. for 10 min for PTAA). In another specific embodiment, a hole transport layer (e.g., N,N'-Bis(3-methylphenyl)-N,N-diphenylbenzidine (TPD) plus (z)-2-cyano-3-(4-(diphenylamino)phenyl)acrylic acid (TPACA)) can be applied to the ITO substrate, e.g., by depositing a 15 nm thick TPD+TPACA layer with 0.25% by mass DCB solution onto the ITO substrate and cross-linking using a UV lamp and drying the TPD+TPACA (e.g., drying in $N_2$ at 100° C. for 10 min). Heating the ITO substrate (e.g., ITO with hole transport layer) can include using at least one heating device 102.

In step 604, a perovskite precursor solution is dropped onto the ITO substrate. In certain embodiments, the perovskite precursor solution includes lead halide and methylammonium halide mixed in dimethylformamide (DMF) or Methyl sulfoxide (DMSO). In one specific embodiment, a perovskite precursor solution is dropped onto an ITO substrate including hole transport materials. In a specific embodiment, 10-20 µL of perovskite precursor solution can be dropped onto the ITO substrate for about every 2.25 $mm^2$ of ITO substrate. Other processes, such as spin coating, may use as much as 50-100 µL of the same perovskite precursor solution over the same substrate area.

In embodiments, the perovskite precursor solution can include a methylammonium halide (MAH), such as methylammonium iodide ($CH_3NH_3I$, MAI), methylammonium bromide ($CH_3NH_3Br$, MABr), or methylammonium chloride ($CH_3NH_3Cl$, MACl), or formamidinium halide (FAH), such as formamidinium iodide ($CH(NH_3)_2I$, FAI), formamidinium bromide ($CH(NH_3)_2Br$, FABr), or formamidinium chloride ($CH(NH_3)_2Cl$, FACl), and lead halide ($PbI_2$, $PbBr_2$, $PbCl_2$) dissolved in dimethylformamide (DMF) or Methyl sulfoxide (DMSO) or a mixture of the two in any ratio. In these embodiments, a 1:1 molar ratio between lead halide and the methylammonium halide (or formamidinium halide) may be used, e.g., at a mass ratio of 40% $PbI_2$ (e.g., 400 mg per 1 mL solvent) and 13.8% methylammonium halide.

In step 606, the perovskite precursor solution is doctor-bladed, e.g., linearly swiped using a doctor blade, to form a perovskite film. In an implementation, the dropped perovskite precursor solution 118 (FIG. 2) can be swiped linearly by a doctor blade 116 (e.g., a glass blade) at a speed of about 0.75 cm/s (27 m/hour) resulting in a smooth perovskite film 110. The doctor blade 116 functions to remove excess perovskite precursor solution and smooth the remaining perovskite precursor solution. A high deposition (dropping and blading) speed is advantageous when fabricating large area perovskite devices with a high throughput. The thickness of the perovskite film 110 during doctor-blade coating may be controlled by perovskite precursor solution concentration, blading speed, and the spacing of the doctor-blade relative to the ITO substrate. In certain embodiments, the ITO substrate should be maintained at an elevated temperature during doctor-blade deposition for the formation of a smooth, pin-hole free perovskite film 110.

As discussed above, during doctor-blade deposition, the substrate temperature may be an important parameter for creating uniform, smooth and pin-hole free perovskite films.

In step 608, the perovskite film 110 is thermoannealed and solvent annealed. In one embodiment, the perovskite film 110 can be simultaneously thermoannealed and solvent annealed, which can facilitate inter-diffusion between layers. In a specific embodiment, thermoannealing and solvent annealing perovskite film 110 includes thermoannealing the perovskite film 110 at about 100° C. for about 10 minutes to about 60 minutes and simultaneously solvent annealing the perovskite film 110 with about 10 μL of DMF. It is contemplated that other heating temperatures and durations (e.g., several minutes to several hours) and other solvents and/or concentrations may be utilized for thermoannealing and/or solvent annealing of perovskite film 110.

In step 610, charge transport layer (e.g. $PC_{60}BM$) layer may be deposited onto the perovskite film. In one specific example, $PC_{60}BM$, dissolved in 2% by weight 1,2-dichlorobenzene (DCB) solution, is applied to the perovskite film to form a $PC_{60}BM$ layer. In some implementations, depositing the $PC_{60}BM$ layer may include using a liquid solution dropping and/or a doctor-blading process. However, other deposition processes may be utilized, such as spin coating. In step 612, the $PC_{60}BM$ layer is thermoannealed. For example, the $PC_{60}BM$ layer can be further thermoannealed at about 100° C. for about 10 minutes to 60 minutes without or with solvent (e.g. DCB) annealing. Thermoannealing can serve to further interdiffuse the layers and/or further stabilize the $PC_{60}BM$ layer.

In optional step 614, a fullerene layer is deposited on the $PC_{60}BM$ layer. In certain embodiments, a fullerene layer may be deposited on the $PC_{60}BM$ layer using, for example, a thermal deposition process. In one specific example, depositing a fullerene layer includes depositing a 20 nm thick layer of $C_{60}$ and an 8 nm thick layer of BCP using thermal evaporation. It is contemplated that other fullerene materials and/or other layer thicknesses may be used.

In step 616, a conducting layer (e.g., including a conductive material such as a metal layer) is then formed on the fullerene layer to function as a cathode and/or an anode. In one embodiment, a metal layer can be deposited, e.g., deposition of a metal layer (e.g., Ag, Al, Cu, Au, etc) on the fullerene layer using a sputtering process. In another specific embodiment, forming a conducting layer includes rolling and laminating a conductive tape 114 onto the fullerene layer and/or a perovskite film 110.

In a specific embodiment, a perovskite device 124 may include a cathode layer, an anode layer, and a halide perovskite layer (e.g., perovskite film 110) disposed between the cathode layer and the anode layer. In some specific implementations, a semiconductor device and/or perovskite device 124 may include a first buffer layer, a second buffer layer, and one or more passivation layers (e.g., a single layer of fullerenes, a mixture of fullerenes, a stacking layer of fullerenes, and/or other material layers).

The cathode layer can include a cathode, which can include an electrode from which a conventional current leaves a polarized electrical device. The anode layer can include an anode, which can include an electrode through which positive electric charge flows into a polarized electrical device, such as the semiconductor device and/or perovskite device 124. One specific embodiment can include an anode layer (e.g., an ITO layer 108) which itself may be disposed on a glass substrate and/or a silicon substrate and/or a flexible substrate, an active layer (e.g., perovskite layer), and a cathode layer (e.g., an aluminum layer, a silver layer, a gold layer, etc.) configured to be a top layer on the active layer (e.g., distal from the ITO substrate, glass substrate and/or silicon substrate). In another specific embodiment, an inverted device configuration can include a cathode layer (e.g., ITO layer) which may be disposed on a glass substrate and/or silicon substrate and/or a flexible substrate, an active layer, and an anode layer (e.g., a silver layer, gold layer, aluminum layer, etc) configured to be a top layer (e.g., distal from the ITO layer, glass substrate and/or silicon substrate). In some embodiments, the bottom layer (e.g., proximate to a glass substrate and/or a silicon substrate) can function as a transparent electrode (e.g., an ITO layer), and the top layer (e.g., distal from the glass substrate and/or silicon substrate) can function as an opaque electrode (e.g., an aluminum layer or a silver layer or a gold layer).

In some specific embodiments, the cathode layer can include an Al layer and/or a Ag layer that functions as a cathode, and the anode layer can include an indium-tin oxide (ITO) layer that functions as an anode. In other specific embodiments, the cathode layer can include an indium-tin oxide (ITO) layer that functions as a cathode, and the anode layer can include an aluminum layer that functions as an anode. Other materials may also be used to form the cathode layer, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials. Further, other materials may be used to form the anode layer (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene. In some embodiments, the cathode layer can be formed first (e.g., disposed on a glass substrate and/or silicon substrate) while the anode layer is formed last (e.g., a cathode layer is formed on a glass substrate and the anode layer is formed last on a buffer layer). In another embodiment, the anode layer can be formed first while the cathode layer can be formed last (e.g., an anode layer is formed on a glass substrate and/or silicon substrate and the cathode layer is formed last on a buffer layer).

The semiconductor device and/or perovskite device 124 can include an active layer, which can include perovskite film 110. In implementations, the active layer serves to absorb light. In one specific example, an active layer can be configured to absorb light having a wavelength in a first predetermined range, and the anode layer may be transparent to light having a wavelength in a second predetermined range, the second predetermined range overlapping the first predetermined range in a third predetermined range. In this specific example, the semiconductor device and/or perovskite device 124 may have a high resistivity when not illuminated by any light and may have a low resistivity when illuminated by light having a wavelength in the third predetermined range. In an embodiment, the active layer can include a perovskite film 110 (e.g., a halide perovskite device), which can function as a photovoltaic material and include a photovoltaic perovskite material (e.g., perovskite film 110). The perovskite film 110 can be disposed between the cathode layer and the anode layer. In some specific embodiments, the perovskite film 110 can include a continuous perovskite film that can be formed by the interdiffusion of solution-deposited lead (II) iodide ($PbI_2$) and methylammonium halide ($CH_3NH_3X$, where X can include Cl, Br, I) stacked pre-cursor layers. In these embodiments, the stacked pre-cursor layers can subsequently be annealed to facilitate interdiffusion between the layers. The resulting high quality perovskite film 110 allows the fabrication of leakage-free photovoltaic devices and a high PCE of 15-17%.

In other embodiments, the active layer can include at least one of polyvinyl carbazole (PVK), poly(3-hexylthiophene) (P3HT), poly[4,8-bis-(2-ethyl-hexylthiophene-5-yl)-benzo[1,2-b:4,5-b'] dithiophene-2,6-diyl]-alt-[2-(2'-ethyl-hexanoyl)-thieno [3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2, 1,3-benzothiadiazole] (PFDDTBT), poly{[2,7-(9,9-bis-(2-ethylhexyl)-fluorene)] alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisDMOPFDTBT), poly[N-9''-hepta-decanyl-2,7-carbazole-alt-5,5-(4',7'-di-2-thienyl-2',1',3'benzothiadiazole)] (PCDTBT), and/or a combination of at least two of the above materials.

Additionally, a semiconductor device and/or the perovskite device 124 may include a trapping layer, a first buffer layer, and/or a second buffer layer. The trapping layer, the first buffer layer, and/or the second buffer layer can be disposed between the active layer and the cathode layer and/or between the active layer and the anode layer. In implementations, the trapping layer can function as a carrier or charge trapping layer (hole transporting/electron blocking layer) which can include at least one of zinc oxide (ZnOx), titanium oxide (TiOx), tin oxide (SnOx), zinc sulfide (ZnS), cadmium sulfide (CdS), lead sulfide (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}CdxTe$, InAsSb, InNSb, InBiTe, InTlSb, InAs/GaInSb super lattice, HgTe/CdTe super lattice, graphene quantum dots, carbon nanotubes, and/or fullerene. Additionally, the trapping layer may include organic electron trapping particles, which can further include at least one of a fullerene, a derivative of fullerene, a perylene derivative, a 2,7-dicyclohexyl benzo, phenanthroline derivative, a 1,4-diketo-3,6-dithienylpyrrolo [3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methy ester (PC60BM), [6,6]-phenyl C71-butyric acid methyl ester (PC70BM), [6,6]-(4-fluoro-phenyl)C61-butyric acid methyl ester (FPCBM), carbon 60 ($C_{60}$), carbon 70 ($C_{70}$), fullerene self-assembly layer ($C_{60}$-SAM), carbon nanotubes (CNT), a carbon onion, and/or a combination of two or more of the above materials. In some embodiments, the trapping layer may be integrated into a first buffer layer and/or a second buffer layer. In a specific example, a second buffer layer can include a double fullerene layer (e.g., [6,6]-phenyl-$C_{61}$-butyric acid methyl ester (PCBM) and indene-$C_{60}$ bisadduct (ICBA)) disposed between an active layer and an anode layer.

The first buffer layer and/or the second buffer layer can be formed on at least one side (e.g., anode side and/or the cathode side) of the perovskite film 110 and can function to passivate the perovskite surface and/or grain boundaries. In embodiments, the first buffer layer and/or the second buffer layer may include at least one of an organic material, self-assembled monolayers (SAMs), poly(3,4-ethylenedioxithiophene) (PEDOT) doped with poly(styrene sulfonicacid) (PSS), Poly[bis(4-phenyl)(2,4,6-trimethylphenyl) amine] (PTAA), 4,4'bis[(ptrichlorosilylpropylphenyl) phenylamino] biphenyl (TPD-$Si_2$), poly(3-hexyl-2,5-thienylene vinylene) (P3HTV) and C60, copper phthalocyanine (CuPc), poly[3,4-(1hydroxymethyl) ethyl-enedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'bis[(p-trichlorosilylpropylphenyl) phenylamino] biphenyl (TSPP), 5,5'-bis[(ptrichlorosilylpropylphenyl) phenyl amino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, and/or Au nanoparticles.

In some embodiments, a second buffer layer may include at least one of an alkali metal compound, a metal oxide, an organic material, self-assembled mono layers (SAMs), LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, [6,6]-phenyl C61-butyric acid methyl ester (PCBM), [6,6]-phenyl C61-butyric acid methyl ester (PC70BM), pentadecafluorooctyl phenyl-$C_{60}$-butyrate (F-PCBM), $C_{60}$, $C_{60}$/LiF, ZnO NRs/PCBM, ZnO/cross-linked fullerene derivative (C-PCBSD), single walled carbon nanotubes (SWCNT), poly(ethylene glycol) (PEG), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFP-NBr), or poly(ethylene oxide) (PEO). In one specific embodiment, the second buffer layer includes at least one layer of $C_{60}$, PCBM, and/or ICBA.

In one specific embodiment, a semiconductor device and/or the perovskite device 124 includes a structure including a cathode layer including Indium-Tin oxide formed on a glass substrate, a first buffer layer including poly(3,4-ethylenedioxythiophene) poly(styrenesulphonate) (PEDOT:PSS) disposed on the cathode layer, an active layer and a perovskite film 110 including $MAPbI_3$ (e.g., iodine perovskite) formed on the first buffer layer, a trapping layer and second buffer layer including [6,6]-phenyl-$C_{61}$-butyric acid methyl ester (PCBM with about a 20 nm thickness) or indene-$C_x$ bisadduct (ICBA), $C_{60}$ (e.g., about a 20 nm thickness), and 2,9-dimethyl-4,7-diphenyl-1,10-phenanthroline (BCP, with about a 7 nm thickness) formed on the active layer, and an anode layer including aluminum (with a thickness of about 100 nm) formed on the trapping layer and second buffer layer. In this specific embodiment, a perovskite precursor solution may be formed on the semiconductor device and/or the perovskite device 124 separately or as a pre-mixed precursor. This configuration can result in a continuous, pin-hole free perovskite film 110 with a film thickness variation often less than 20 nm. After an annealing process, the semiconductor device and/or the perovskite device 124 results in a layered structure with penetration of Pb and I across the whole perovskite layer. In one instance, the depth profile of Pb and I may include a graded composition with increased Pb and I toward the PEDOT:PSS side. The perovskite-based semiconductor device and/or the perovskite device 124 can function as a highly sensitive UV and visible light photo detector. In another specific embodiment, the semiconductor device and/or the perovskite device 124 can include an anode layer (e.g., Al) and a first buffer layer including a layer of ITO, a perovskite film 110 on the anode layer and the first buffer layer, a trapping layer including $TPD-Si_2$ disposed on the perovskite film 110, a second buffer layer including $MoO_3$ disposed on the trapping layer, and a cathode layer (e.g., ITO) disposed on the trapping layer.

Some halide perovskite materials can only absorb light up to about 800 nm, and thus may not have light detection ability in the near-IR range. In one implementation, a quantum dots (QDs) halide perovskite hybrid semiconductor device can extend light detection to near-IR range. In this implementation, the semiconductor device can include an active layer including quantum dots, which can be operated as sensitizers while the halide perovskite layer can serve as a functional interface from which to extract carriers and also as bridges to transfer carriers between quantum dots. In these implementations, PbS quantum dots can be integrated into a first buffer layer and/or a second buffer layer including a PCBM to form a PCBM matrix. This specific semiconductor device can function as a highly sensitive board wavelength photo detector.

Some fabrication processes include methods for forming continuous and/or compact lead iodine perovskite ($MAPbI_3$) films by the interdiffusion of formed and/or spin-coated layers of stacked $PbI_2$ and MAI. The resulting high quality perovskite film can allow for the fabrication of leakage-free photovoltaic devices and a high PCE of 15-17%. In these fabrication processes, a lead iodine ($PbI_2$) layer can be formed on a cathode layer, and a methylammonium halide (MAI) layer can be formed on the lead iodine layer. In other embodiments, the precursors (e.g., MAI and $PbI_2$) can be pre-mixed prior to applying and/or spin-coating the perovskite film on a first buffer layer, a cathode layer, and/or an anode layer. It is contemplated that other lead-based layers can be formed (e.g., $PbX_2$, where X can be Br, Cl, etc.). In a specific implementation, $PbI_2$ and MAI can be dissolved in dimethylformamide (DMF) and 2-propanol, respectively, as precursor solutions at varied concentrations. The respective precursor solutions can then be formed, dropped, and/or spun onto a substrate, such as a glass substrate and/or a first buffer layer. In some implementations, the glass substrate 106 can include a first buffer layer, such as poly(3,4-ethylenedioxythiophene) poly(styrenesulphonate) (PEDOT:PSS). Additionally, the glass substrate may be covered with a cathode layer, such as indium tin oxide (ITO). In other implementations, the glass substrate may include an anode layer instead of a cathode layer, such as an aluminum layer. In some implementations, the $PbI_2$ layer may be formed first and disposed under the MAI layer. In other implementations the MAI layer may be formed first and disposed under the $PbI_2$ layer. In some embodiments, a supersaturated hot solution of $PbI_2$ may be used for quick drying to obtain a pin-hole free and conformal $PbI_2$ layer on a PEDOT:PSS layer and/or a glass substrate. Since $PbI_2$ has relatively low solubility in 2-propanol, the spin-coating of MAI will not wash off $PbI_2$.

In one implementation for forming a lead iodide ($PbI_2$) layer and a methylammonium halide (MAI) layer, a $CH_3NH_3I$ precursor is synthesized. In a specific example, a concentrated aqueous solution of hydroiodic acid (HI) (e.g., 15.0 mL, 57 wt % in water) can be reacted with methylamine ($CH_3NH_2$) (e.g., 13.5 mL, 40 wt % in aqueous solution) at 0° C. for 2 hours with constant stirring under a nitrogen atmosphere. Methylammonium can then be crystalized by removing the solvent using a rotary evaporator. In this specific example, the resulting white powder can be washed with diethyl ether (e.g., three times) and dried in a vacuum.

In a specific implementation (e.g., for fabricating a solar cell), $PbI_2$ and/or MAI can be dissolved in DMF and 2-propanol with varying concentrations from about 130 mg/ml to about 450 mg/ml for $PbI_2$, and from about 17.5 mg/ml to about 50 mg/ml for MAI, respectively. In another specific implementation (e.g., for fabricating a photodetector), concentrations can include about 400-800 mg/ml for $PbI_2$ and about 15-60 mg/ml for MAI. In some implementations, the $CH_3NH_3X$ and $PbX_2$ precursor mixture solutions dissolved in dimethylformamide (DMF) can include varied $PbI_2/CH_3NH_3I$ precursor molar ratios (defined as a precursor ratio) from about 0.35 to about 1.5. The thickness of the $CH_3NH_3PbI_3$ films (e.g., from about 80 nm to about 5,000 nm) may be determined by varying the concentration of the precursor solutions. In one specific example, the precursor solutions can have a precursor ratio between about 0.5 to about 0.9, which may result in an iodine perovskite thickness of between about 200-500 nm. In some embodiments, a thicker perovskite film of about 1,000-8,000 nm may be used for mixed halide perovskites. In some implementations, the temperature of the precursor solution(s) can be generally above room temperature. A high concentration precursor solution may be used to form a relatively thicker perovskite film. In this specific embodiment, both solutions may be heated at about 100° C. for approximately 10 min before use to ensure that both the MAI and $PbI_2$ are fully dissolved. The $PbI_2$ solution can be subsequently formed and/or spun on a PEDOT:PSS layer or other substrate at about 70° C. at 6,000 round per second (rpm) for 35 seconds. Then, the $PbI_2$ film can be quickly transferred onto a hot plate and dried at about 70° C. The MAI solution can be spun on top of the dried $PbI_2$ film at 6,000 rpm for 35 seconds at room temperature in order to form a film with thickness ranging from about 70-320 nm. The MAI layer thickness may depend the precursor solution concentration as well as the thickness of the underlying PbI$_2$ layer. The spin coated PbI$_2$ and MAI stacking films may then be dried at about 100° C. from one to three hours. In this specific implementation, a PCBM layer (e.g., dissolved in Dichlorobenzene (DCB), (e.g., 2 wt. %) may be spun on the formed perovskite layers after cooling to room temperature.

The lead iodine layer and the methylammonium halide layer may then be annealed to form an interdiffused perovskite film 110. In implementations, the PbI$_2$ and MAI layers can be solvent annealed and/or thermally annealed for varied durations. In one example of thermal annealing, the PbI$_2$ and MAI layers can be annealed at a temperature of about 80-120° C. for about 30-180 mins. In a specific example of solvent annealing, about 10 µL of DMF solvent can be added proximate to the PbI$_2$ and MAI layers during the thermal annealing process such that the DMF vapor can contact the perovskite layer. The DMF vapor may penetrate into the perovskite film and facilitate the growth of crystalline domains. The resulting annealed perovskite film 110 may be generally continuous and pinhole-free across the whole surface. In contrast, bilayer MAPbI$_3$ films formed and spun from premixed PbI$_2$ and MAI blend solutions generally may be non-uniform with many microstructures on the surface. In one specific embodiment, a PbI$_2$, MAI, and PCBM layer can be annealed at 100° C. for one hour to let the PCBM crystalize and/or diffuse into a resulting perovskite layer. In another specific embodiment, a mixed halide perovskite layer may be annealed for about 2 hours. In some instances, the perovskite film 110 may be finished by forming additional layers (e.g, a second buffer layer, a trapping layer, etc.). In a specific example, a fullerene layer can be formed using thermal evaporating (e.g., C$_{60}$ (20 nm), BCP (8 nm)).

An anode layer can then be formed on the perovskite film 110. In implementations, the anode layer can be formed on the perovskite film 110, second buffer layer, and/or trapping layer using processes such as physical vapor deposition. In a specific embodiment, an aluminum anode can be formed to a thickness of about 100 nm. In another specific embodiment, the semiconductor device and/or perovskite device 124 area can be defined to be the overlap of the cathode layer (e.g., ITO) and anode layer (e.g., an aluminum electrode) to be about 6 mm$^2$.

U.S. application Ser. No. 14/576,878, filed Dec. 19, 2014, entitled "Photovoltaic Perovskite Material and Method of Fabrication," provides additional detail regarding device materials and processes and is hereby incorporated by reference herein for all purposes.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed:

1. A process for fabricating a perovskite device, comprising:
   receiving a substrate;
   forming a perovskite film on the substrate using a linear deposition device that deposits and evenly distributes a perovskite precursor solution onto the substrate, wherein the precursor solution includes a lead halide and at least one of a methylammonium halide or a formamidinium halide dissolved in dimethylformamide (DMF) or Methyl sulfoxide (DMSO).

2. The process of claim 1, further comprising:
   heating the substrate while forming the perovskite film.

3. The process of claim 1, wherein the substrate is moving and the linear deposition device is stationary.

4. The process of claim 1, wherein the substrate is moving at a rate of about 0.75 to about 75 cm/sec relative to the linear deposition device.

5. The process of claim 1, wherein the substrate is stationary and wherein the linear deposition device moves relative to the substrate.

6. The process of claim 1, wherein the forming the perovskite film includes dispensing between about 10 µL and about 20 µL of perovskite precursor solution for every 2.25 mm$^2$ of substrate.

7. The process of claim 1, wherein the substrate comprises indium tin oxide (ITO) or other transparent conductive electrode material.

8. The process of claim 1, wherein the perovskite film on the substrate comprises a perovskite device, the method further including:
   heating the perovskite device; and
   applying a conductive material onto the perovskite device.

9. The process of claim 1, wherein the linear deposition device comprises a doctor blade.

10. The process of claim 2, wherein the heating the substrate includes heating the substrate to a temperature in a range of between about 50° C. and about 180° C.

11. The process of claim 10, wherein the heating the substrate includes heating the substrate to about 125° C.

12. A process for fabricating a perovskite device, comprising:
receiving a substrate;
forming a perovskite film on the substrate using a linear deposition device that deposits and evenly distributes a perovskite precursor solution onto the substrate, wherein the perovskite film on the substrate comprises a perovskite device, the method further including:
heating the perovskite device; and
applying a conductive material onto the perovskite device, and wherein the applying includes rolling a conductive tape onto the perovskite device, wherein the conductive tape includes an adhesive material and the conductive material.

13. The process of claim 8, wherein heating the perovskite device includes heating the perovskite device to a temperature between about 50° C. and about 175° C.

14. A process for fabricating a perovskite device, comprising:
receiving a substrate;
forming a perovskite film on the substrate using a linear deposition device that deposits and evenly distributes a perovskite precursor solution onto the substrate, wherein the linear deposition device comprises a doctor blade, and wherein the forming includes:
applying the perovskite precursor solution onto the substrate; and then
linearly swiping the perovskite precursor solution using the doctor blade to form the perovskite film on the substrate.

15. A process for continuously laminating a perovskite device, comprising:
forming a perovskite device having a perovskite film on a substrate by forming the perovskite film on the substrate using a linear deposition device that deposits and evenly distributes a perovskite precursor solution onto the substrate;
heating the perovskite device; and
applying a conductive material onto the perovskite device, wherein the applying includes rolling a conductive tape onto the perovskite device, wherein the conductive tape includes an adhesive material and the conductive material.

16. The process of claim 15, wherein heating the perovskite device includes heating the perovskite device to a temperature between about 50° C. and about 175° C.

17. The process of claim 15, wherein the substrate comprises indium tin oxide (ITO) or other transparent conductive electrode material, and wherein the conductive material includes at least one of aluminum, copper, nickel, gold, or silver.

18. The process of claim 15, wherein the linear deposition device comprises a doctor blade.

19. A process for fabricating a perovskite device, comprising:
receiving a substrate; and
linearly depositing a perovskite solution onto the substrate to form a perovskite film, wherein the perovskite solution includes a lead halide and at least one of a methylammonium halide or a formamidinium halide dissolved in dimethylformamide (DMF) or Methyl sulfoxide (DMSO).

20. The process of claim 19, further comprising:
heating the substrate while linearly depositing the perovskite solution.

21. The process of claim 19, further comprising applying a conductive material onto the perovskite device.

* * * * *